(12) United States Patent
Hack et al.

(10) Patent No.: US 8,979,291 B2
(45) Date of Patent: Mar. 17, 2015

(54) LIGHTING DEVICES INCLUDING TRANSPARENT ORGANIC LIGHT EMITTING DEVICE LIGHT PANELS AND HAVING INDEPENDENT CONTROL OF DIRECT TO INDIRECT LIGHT

(71) Applicant: Universal Display Corporation, Ewing, NJ (US)

(72) Inventors: Michael Hack, Princeton, NJ (US); Ruiqing Ma, Morristown, NJ (US); Duncan Jackson, New York, NY (US); Eoin Billings, New York, NY (US)

(73) Assignee: Universal Display Corporation, Ewing, NJ (US)

( * ) Notice: Subject to any disclaimer, the term of this patent is extended or adjusted under 35 U.S.C. 154(b) by 164 days.

(21) Appl. No.: 13/888,844

(22) Filed: May 7, 2013

(65) Prior Publication Data
US 2014/0334146 A1 Nov. 13, 2014

(51) Int. Cl.
*G09F 13/04* (2006.01)
*F21V 14/00* (2006.01)

(52) U.S. Cl.
CPC .................... *F21V 14/003* (2013.01)
USPC ............ 362/97.1; 362/84; 362/235; 362/616

(58) Field of Classification Search
USPC .................. 362/97.1, 84, 235, 616
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |

(Continued)

FOREIGN PATENT DOCUMENTS

| | | |
|---|---|---|
| WO | 2008057394 | 5/2008 |
| WO | 2010011390 | 1/2010 |
| WO | 2011146734 | 11/2011 |

OTHER PUBLICATIONS

Baldo, et al., "Highly Efficient Phosphorescent Emission fromOrganic Electroluminescent Devices," Nature, Sep. 10, 1998, 4 pp., Macmillan Publishers Ltd., London, UK.

(Continued)

*Primary Examiner* — Evan Dzierzynski
(74) *Attorney, Agent, or Firm* — Morris & Kamlay LLP (57) ABSTRACT

A lighting device for emitting direct light and indirect light, includes a first transparent light panel comprising at least one organic light emitting device, the first transparent light panel emitting direct light and indirect light during operation thereof; and at least a second transparent light panel comprising at least one organic light emitting device, the second transparent light panel emitting direct light and indirect light during operation thereof, the second transparent light panel being positioned so that at least a portion of indirect light emitted from the first transparent light is transmitted through the second transparent light panel and at least a portion of direct light emitted from the second transparent light panel is transmitted through the first transparent light panel, wherein the first transparent light panel is controllable independently from the second transparent light panel to control a ratio of direct light to indirect light emitted by the lighting device. Other aspects are described and claimed.

60 Claims, 4 Drawing Sheets

(56) References Cited

U.S. PATENT DOCUMENTS

| | | |
|---|---|---|
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,620,731 B1 | 9/2003 | Farnworth |
| 6,885,157 B1 | 4/2005 | Cok |
| 7,279,704 B2 | 10/2007 | Walters |
| 7,304,634 B2 | 12/2007 | Albert |
| 7,431,968 B1 | 10/2008 | Shtein |
| 7,814,652 B2 | 10/2010 | Bellew |
| 7,845,826 B2 * | 12/2010 | Aylward et al. ............... 362/243 |
| 7,968,146 B2 | 6/2011 | Wagner |
| 2003/0230980 A1 | 12/2003 | Forrest |
| 2004/0174116 A1 | 9/2004 | Lu |
| 2012/0181933 A1 | 7/2012 | Ma |
| 2012/0212931 A1 * | 8/2012 | Kinoshita et al. ............... 362/84 |
| 2012/0286298 A1 | 11/2012 | Pang |
| 2012/0286651 A1 | 11/2012 | Levermore |
| 2013/0000329 A1 | 1/2013 | Smith |
| 2013/0229598 A1 * | 9/2013 | Kamada ......................... 349/69 |
| 2013/0241076 A1 | 9/2013 | Mandlik |

OTHER PUBLICATIONS

Baldo, et al., "Very high-efficiency green organic light-emitting devices based on electrophosphorescence," Applied Physics Letters, Jul. 5, 1999, 4 pp., vol. 75, No. 1, American Institute of Physics, Melville, NY, USA.

* cited by examiner

LIGHTING DEVICES INCLUDING TRANSPARENT ORGANIC LIGHT EMITTING DEVICE LIGHT PANELS AND HAVING INDEPENDENT CONTROL OF DIRECT TO INDIRECT LIGHT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD

In a number of embodiments, devices, systems and methods hereof relate to lighting devices including transparent organic light-emitting electronic device ("TOLED") light panels in which the ratio of direct to indirect light emitted by the lighting device may be altered.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding the technologies or the background thereof. The disclosure of all references cited herein are incorporated by reference.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

In this structure, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

More details on OLEDs, and the definitions described above, can be found in U.S. Pat. No. 7,279,704, which is incorporated herein by reference in its entirety.

Many modern light fixtures illuminate a space by providing both direct and indirect lighting. With conventional lighting device, however, it is generally not possible to independently control the relative brightness of the direct and indirect components. For example, currently available suspended lamps usually use the same light source (lamp) to provide both the direct and indirect light.

BRIEF SUMMARY

In summary, in one aspect, a lighting device for emitting direct light and indirect light, comprising a first transparent light panel comprises at least one organic light emitting device, the first transparent light panel emitting direct light and indirect light during operation thereof; and at least a second transparent light panel comprising at least one organic light emitting device, the second transparent light panel emitting direct light and indirect light during operation thereof, the second transparent light panel being positioned so that at least a portion of indirect light emitted from the first transparent light is transmitted through the second transparent light panel and at least a portion of direct light emitted from the second transparent light panel is transmitted through the first transparent light panel, wherein the first transparent light panel is controllable independently from the second transparent light panel to control a ratio of direct light to indirect light emitted by the lighting device.

In a number of embodiments, the at least one organic light emitting device of the first transparent light panel is transparent and the at least one organic light emitting device of the second transparent light panel is transparent. In a number of embodiments, the lighting device is adapted to or operable to achieve an imbalance in the ratio of direct light to indirect light of at least 33%.

In a number of embodiments, at least one of the first transparent light panel and the second transparent light panel emits direct light and indirect light unequally. The first transparent light panel may emit direct light and indirect light unequally, and the second transparent light panel may emit direct light and indirect light unequally. In a number or of embodiments, a first ratio of direct light emitted by the first transparent light panel to indirect light emitted by the first transparent light panel is greater than 1, and a second ratio of direct light emitted by the second transparent light panel to indirect light emitted by the second transparent light panel is less than 1. In a number of other embodiments, a first ratio of direct light emitted by the first transparent light panel to indirect light emitted by the first transparent light panel is less than 1, and a second ratio of direct light emitted by the second transparent light panel to indirect light emitted by the second transparent light panel is greater than 1. The first ratio may, for example, be approximately equal to the second ratio.

The first transparent light panel may, for example, include a plurality of transparent organic light emitting devices, and a color temperature and/or a color of light emitted therefrom may, for example, be adjustable. The second transparent light panel may, for example, include a plurality of transparent organic light emitting devices, and a color temperature and/or a color of light emitted therefrom may, for example, be adjustable. The first transparent light panel may, for example, have a different color or a different color temperature than the second transparent light panel.

In a number of embodiments, direct light emitted from the lighting device has a peak luminance less than 5,000 cd/m$^2$. In a number of embodiments, direct light emitted by the lighting device includes no greater than 1% light having a peak wavelength less than 440 nm. The lighting device may, for example, emit greater than 50 lumens of light at maximum illumination, greater than 100 lumens of light at maximum illumination or even greater than 150 lumens of light at maximum illumination.

At least one of the first transparent light panel and the second transparent light panel may, for example, be flexible. In a number of embodiments, each of the first transparent light panel and the second transparent light panel has a transmittance of at least 10%, a transmittance of at least 50%, a transmittance of at least 75%, a transmittance of at least 80% or a transmittance of at least 85%. Each of the first transparent light panel and the second transparent light panel may, for example, independently have a transmittance in the range of 10% to 90%.

In a number of embodiments, the lighting device further includes a control system, and the intensity of light emitted by the first transparent light panel is controllable independently from intensity of light from the second transparent light panel via the control system to control the ratio of direct light to indirect light emitted by the lighting device. In a number of embodiments, the lighting device further includes a control system, and the intensity of light emitted by the first transparent light panel is controllable independently from intensity of light from the second transparent light panel via the control system while the ratio of direct light to indirect light emitted by the lighting device is maintained substantially constant. In a number of embodiments, the lighting device further includes a control system, and the intensity of light emitted by the first transparent light panel is controllable independently from intensity of light from the second transparent light panel by the control system to achieve the ratio of direct light to indirect light emitted by the lighting device input to the control system.

In a number of embodiments, the first transparent lighting panel and the at least second transparent lighting panel are optically coupled together. The first transparent lighting panel and the at least second transparent lighting panel may, for example, be optically coupled together by a transparent adhesive.

Another aspect provides a method of providing direct light and indirect light, comprising providing a first transparent light panel comprising at least one organic light emitting device, the first transparent light panel emitting direct light and indirect light during operation thereof; and providing at least a second transparent light panel comprising at least one organic light emitting device, the second transparent light panel emitting direct light and indirect light during operation thereof, the second transparent light panel being positioned so that at least a portion of indirect light emitted from the first transparent light is transmitted through the second transparent light panel and at least a portion of direct light emitted from the second transparent light panel is transmitted through the first transparent light panel, and controlling the first transparent light panel independently from the second transparent light panel to control a ratio of overall direct light to overall indirect light emitted by the first transparent lighting panel and the at least second transparent lighting panel.

As described above, in a number of embodiments, the at least one organic light emitting device of the first transparent light panel is transparent and the at least one organic light emitting device of the second transparent light panel is transparent. The first transparent light panel and the at least a second transparent light panel may, for example, be adapted to or operable to achieve an imbalance in the ratio of overall direct light to overall indirect light of at least 33%.

In a number of embodiments, at least one of the first transparent light panel and the second transparent light panel emits direct light and indirect light unequally. The first transparent light panel may emit direct light and indirect light unequally, and the second transparent light panel may emit direct light and indirect light unequally. In a number or of embodiments, a first ratio of direct light emitted by the first transparent light panel to indirect light emitted by the first transparent light panel is greater than 1, and a second ratio of direct light emitted by the second transparent light panel to indirect light emitted by the second transparent light panel is less than 1. In a number of other embodiments, a first ratio of direct light emitted by the first transparent light panel to indirect light emitted by the first transparent light panel is less than 1, and a second ratio of direct light emitted by the second transparent light panel to indirect light emitted by the second transparent light panel is greater than 1. The first ratio may, for example, be approximately equal to the second ratio.

The first transparent light panel may, for example, include a plurality of transparent organic light emitting devices, and a color temperature and/or a color of light emitted therefrom may, for example, be adjustable. The second transparent light panel may, for example, include a plurality of transparent organic light emitting devices, and a color temperature and/or a color of light emitted therefrom may, for example, be adjustable. The first transparent light panel may, for example, have a different color or a different color temperature than the second transparent light panel.

In a number of embodiments, overall direct light emitted by the first transparent light panel and the at least a second transparent light panel (that is, the direct light emitted by the combination of the first transparent light panel and the at least a second transparent light panel) has a peak luminance less than 5,000 cd/m². In a number of embodiments, overall direct light emitted by the first transparent light panel and the at least a second transparent light panel includes no greater than 1% light having a peak wavelength less than 440 nm. The first transparent light panel and the at least a second transparent light panel may, for example, emit greater than 50 lumens of overall light at maximum illumination, greater than 100 lumens of overall light at maximum illumination or even greater than 150 lumens of overall light at maximum illumination.

At least one of the first transparent light panel and the second transparent light panel may, for example, be flexible. In a number of embodiments, each of the first transparent light panel and the second transparent light panel has a transmittance of at least 10%, a transmittance of at least 50%, a transmittance of at least 75%, a transmittance of at least 80% or a transmittance of at least 85%. Each of the first transparent light panel and the second transparent light panel may, for example, independently have a transmittance in the range of 10% to 90%.

In a number of embodiments, intensity of light emitted by the first transparent light panel is controlled independently from intensity of light from the second transparent light panel via a control system to control the ratio of direct light to indirect light emitted by the lighting device. In a number of embodiments, intensity of light emitted by the first transparent light panel is controlled independently from intensity of light from the second transparent light panel via a control system while the ratio of direct light to indirect light emitted by the lighting device is maintained substantially constant. In a number of embodiments, intensity of light emitted by the first transparent light panel is controlled independently from intensity of light from the second transparent light panel by a control system to achieve the ratio of overall direct light to overall indirect light emitted by the first transparent light panel and the second transparent light panel input to the control system.

The first transparent lighting panel and the at least second transparent lighting panel may, for example, be optically coupled together. The first transparent lighting panel and the at least second transparent lighting panel may, for example, be optically coupled together by a transparent adhesive.

In a further aspect, a method of fabricating a lighting device for emitting direct light and indirect light, comprises providing a first transparent light panel comprising at least one organic light emitting device, the first transparent light panel emitting direct light and indirect light during operation thereof; and providing at least a second transparent light panel comprising at least one organic light emitting device, the second transparent light panel emitting direct light and indirect light during operation thereof, the second transparent light panel being positioned so that at least a portion of direct light emitted from the first transparent light is transmitted through the second transparent light panel and at least a portion of indirect light emitted from the second transparent light panel is transmitted through the first transparent light panel, and providing a control system in operative connection with the first transparent light panel and the second transparent light panel, wherein the control system controls the first transparent light panel independently from the second transparent light panel to control a ratio of direct light to overall indirect light emitted by the first transparent light panel and the at least a second transparent light panel.

The at least one organic light emitting device of the first transparent light panel may, for example, be transparent, and the at least one organic light emitting device of the second transparent light panel may, for example, be transparent. At least one of the first transparent light panel and the second transparent light panel may, for example, emit direct light and indirect light unequally. The first transparent light panel and the at least a second transparent light panel may, for example, be adapted to or operable to achieve an imbalance in the ratio of overall direct light to overall indirect light of at least 33%.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the claimed invention will be pointed out in the appended claims.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
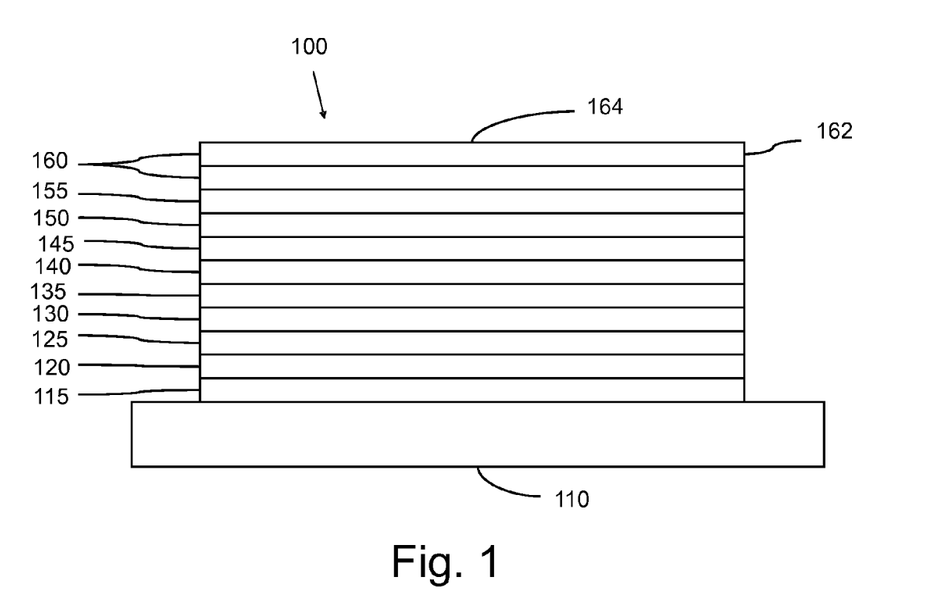
FIG. 1 illustrates schematically an embodiment of an organic light emitting device.

FIG. 1 illustrates an embodiment organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
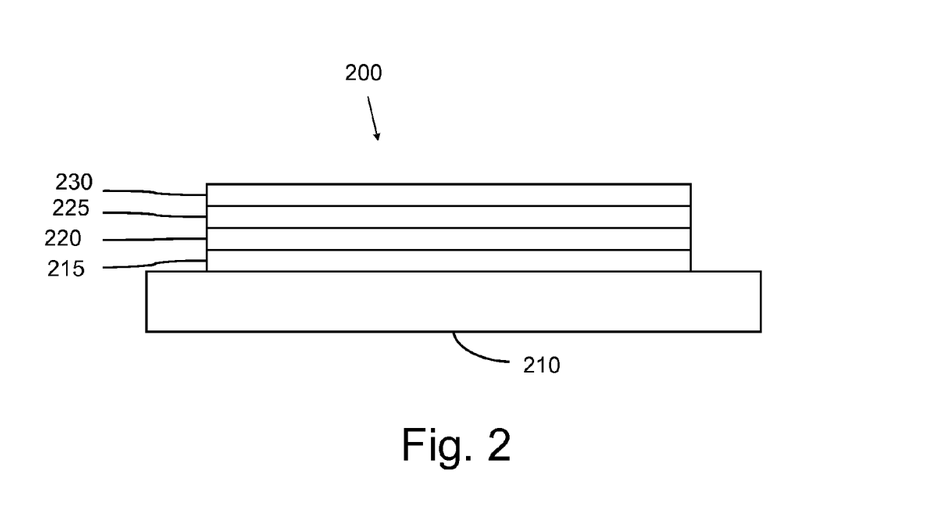
FIG. 2 illustrates schematically an embodiment of an inverted organic light emitting device that does not have a separate electron transport layer.
Figure 4:
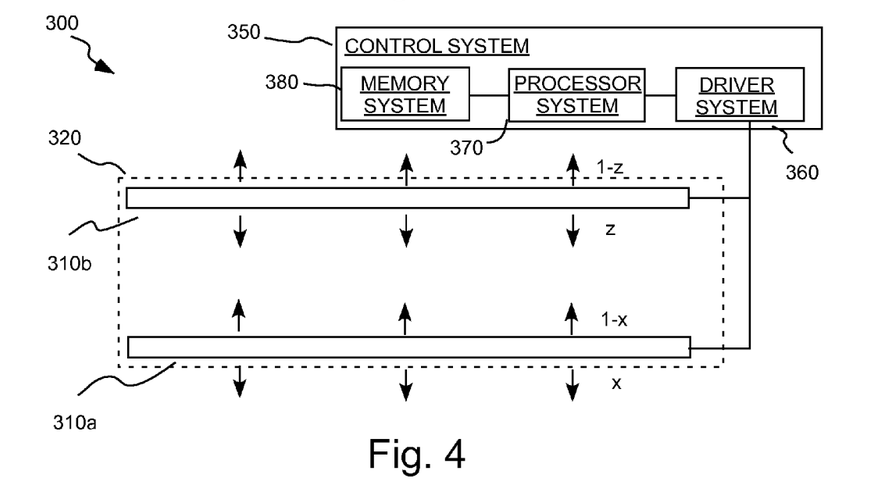
FIG. 4 illustrates another schematic view of the lighting device of FIG. 3 and illustrating a control system in operative connection with the TOLED light panels.

FIG. 2 illustrates an embodiment of inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 4 provides one example of how some layers may be omitted from the structure of device 100.

The simple layered structure illustrated in FIGS. 1 and 2 is provided by way of non-limiting example, and it is understood that embodiments hereof may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although various layers may be described as including a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 3 and 4. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments hereof may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are incorporated herein by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments hereof may be incorporated into a wide variety of consumer products, including flat panel displays, computer monitors, medical monitors, televisions, billboards, lights for interior or exterior illumination and/or signaling, heads up displays, 3-D displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the methods hereof, including passive matrix and active matrix. Many of the devices are intended for use in a temperature range comfortable to humans, such as 18 degrees C. to 30 degrees C., and more preferably at room temperature (20-25 degrees C.), but could be used outside this temperature range (for example, from −40 degrees C. to +80 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a light panel" includes a plurality of such light panels and equivalents thereof known to those skilled in the art, and so forth, and reference to "the light panel" is a reference to one or more such light panels and equivalents thereof known to those skilled in the art, and so forth.

As set forth above, it is generally not possible to independently control the relative brightness of emitted direct light and emitted indirect light in currently available lamps, luminaires or lighting devices. In a number of embodiments hereof, lamps, luminaires or lighting devices include transparent organic electronic device (TOLED) light panels, and the ratio of direct to indirect light emitted by the lighting device may be controlled or altered in a controlled manner via independent control of a plurality of TOLED light panels. The TOLED light panels are placed on top of each other or stacked in a relative position such that at least a portion of the light emitted by each TOLED light panel impinges upon and passes through another TOLED light panel. As TOLEDs are transparent, light emitted by one TOLED in the direction of another TOLED in a TOLED stack will pass through the other TOLED. TOLED lighting devices are readily formed such that they do not emit light equally from both surfaces thereof. In a number of embodiments, using at least one TOLED light panel in a stack of at least two TOLED light panels that emits direct light and indirect light unequally, a transparent lighting device or fixture may be made to provide independently controllable direct and indirect illumination. It is also advantageous in many cases, from a design perspective, to make illumination or light panels transparent, and transparent light panels are readily formed using TOLEDs (transparent OLEDs). Moreover, an additional benefit of using a plurality of TOLED light panels in a lighting device for any given illumination level is that each TOLED need emit only a percentage of the overall light in many states of the lighting device, thereby extending fixture lifetime.

Figure 3:
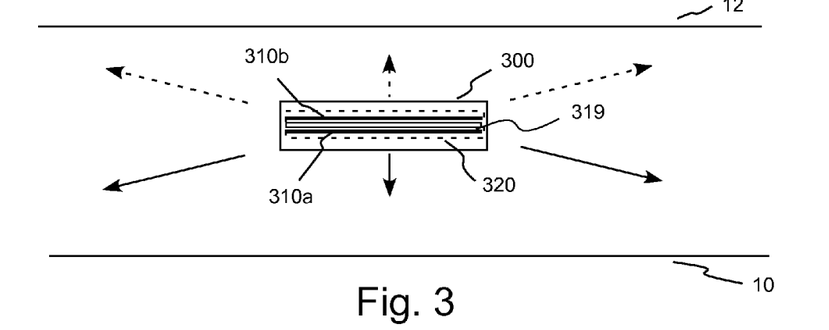
FIG. 3 illustrates schematically an embodiment of a lighting device hereof including two transparent OLED or TOLED light panels and emitting direct and indirect light.

As used herein the terms "indirect light" and "direct light" are defined with respect to two parallel infinite planes or surfaces 10 and 12 between which a lighting device or fixture 300 hereof is positioned as illustrated FIG. 3. Light emitted from device 300 (that is, from TOLED light panels 310a and 310b thereof) that impinges upon first plane 10 is considered direct light, while light emitted from device 300 (from TOLED light panels 310a and 310b thereof) that impinges upon second plane 12 is considered indirect light. In general, a first direction or the direction of direct light is that which can impinge upon the eyes of a person or a field of use of a person, while a second direction or direction of indirect light is the direction generally opposite that of the first direction. In general, indirect light is reflected toward a person or a field of use of the person. For example, in the case of a suspended lighting device such as lighting device 300, surface 10 is representative of the floor and surface 12 is representative of the ceiling. In the case of a wall mounted lighted device such as lighting device 300, surface 10 is representative of an opposing wall and surface 12 is representative of the wall upon which lighting device 300 is mounted.

The first transparent lighting panel and the second transparent lighting panel may be optically coupled together. In a number of embodiments, the first transparent lighting panel and the second transparent lighting panel may, for example, be optically coupled together by, for example, a transparent adhesive 319 (see FIG. 3).

In an number of embodiments hereof, the amount of indirect/direct light available from a lighting device hereof and/or the ratio of direct light to indirect light may be different with respect to different (for example, opposing) orientations of the lighting device. In a number of such embodiments, a user may, for example, select the orientation of the lighting device with respect to a mounting surface to provide different available levels or ratios of direct/indirect light.

Lighting devices hereof may, for example, be used in interior lighting, as for example, suspended ceiling lights or wall mounted lights as described above. Lighting devices hereof may also be used as in exterior lighting, for example, in louvers or upon facades of buildings. Direct/indirect lighting device or luminaires hereof may reduce contrast by balancing the direct light output with the indirect (reflected) light output. The lighting device hereof may, for example, facilitate compliance with various standards (particular relating to office lighting) for contract ratio levels.

As described above, TOLED panels typically do not emit light (for example, measured in lumens) equally from both sides (that is, through the OLED anode and cathode), and they usually emit light in a range of approximately 0.6:0.4 to 0.9:0.1, with more light being emitted from the TOLED anode. The ratio of light emitted by one surface of a TOLED light panel to light emitted by another surface of the TOLED light panel is sometimes referred to herein as a TOLED panel branching ratio. As illustrated, for example, in FIG. 3, a lighting device 300 may include at least two TOLED panels placed on top of each other or stacked. The TOLED panels may, for example, be oriented so that the OLED anodes thereof face outward (that is, the sides or surface thereof which emit more light face outward or away from the other TOLED). Lighting device 300 itself may be substantially transparent.

As used herein with respect to a TOLED light panel, "transparent" refers to the ability to transmit light therethrough. In general, the transmittance of a TOLED light panel hereof (that is, the fraction of light that passes therethrough) is at least 0.1. More typically, the transmittance of a TOLED light panel hereof is at least 0.5. In a number of embodiments, the transmittance of TOLED light panels herein is in the range of 0.5 to 0.8 or in the range 0.5 to 0.90. In the case that the transmittance of two TOLED panels is each in the range of 0.5 to 0.8, the transmittance through both such TOLED panels will be in the range of 0.25 to 0.64.

In general, TOLED light panels are formed upon a transparent substrate. If the OLED devices formed upon the substrate are opaque (that is, not transparent or translucent), light may be transmitted through the OLED only in those regions in which no OLED device is formed. In most embodiments hereof, however, the substrate and the components of the OLED devices formed on the substrate are transparent. In that regard, the substrate, the cathode, the anode, and the organic layers of the OLED device are transparent. When an individual TOLED lighting device is in an off state, it may, for example, be approximately 50% to 90% transparent (that is, the TOLED lighting device has a transmittance in the range of 0.5 to 0.90). When an individual TOLED lighting device is in an on or light emitting state, it allows light to pass in both directions therethrough.

In lighting device 300 and other lighting devices hereof, direct and indirect illumination can be independently controlled by, for example, independently controlling/driving the output of each TOLED light panel thereof. Referring, for example, to FIG. 4, if the emission ratio of TOLED light panel 310a is 80:20 (or 0.8:0.2, wherein x of FIG. 4 is 0.8), then turning on lower TOLED light panel will lead to illumination of X lumens of direct light and 0.25X lumens of indirect light. Turning on upper TOLED light panel 310b of TOLED light panel stack 320 may, for example provide for balanced emission (wherein direct light and indirect light are equal) or a range of ratios of direct to indirect light depending upon the independent control of TOLED light panels 310a and 310b. Ignoring transmission losses (arising from the transmittance of each of TOLED light panels 310a and 310b being less than 1) the ratio of the overall device direct to indirect output when each TOLED light panel is $(x+z):(2-z-x)$. In the case that TOLED light panels 310a and 310b are generally identical (and x is equal to $1-z$) in FIG. 4, turning on each or TOLED light panels to the same level of output will result in a balance emission. Ignoring, transmission losses, the overall "branching ratio" or ratio of direct light to indirect light emittable by lighting device 300 is generally in the range of $z:(1-z)$ to $(1-z):z$.

Considering the transmittance losses as light passes through each TOLED light panel, in the case of TOLED light panel stack 320, the overall or device branching ratio for lighting device 300 will be $(t_1*z+x):((1-z)+t_2*(1-x))$ wherein $t_1$ is the transmittance of TOLED light panel 310a and $t_2$ is the transmittance of TOLED light panel 310b. Because of transmittance losses through TOLED panels, even a TOLED light panel having an inherent or native branching ratio (that is, the observed branching ratio of the TOLED light panel when there are no transmittance losses) of 0.5:0.5, will effectively (or observably) emit direct light and indirect light unequally when combined with another TOLED light panel having a transmittance less than 1. For example, in FIG. 4, for the case that TOLED light panel had an inherent branching ratio of 0.5, combining it with TOLED light panel 310b having a transmittance of 0.8 would result in an effective branching ratio of 0.5:(0.5*0.8) or 0.5:0.4. When combining TOLED light panels, transmittance losses should be considered in providing a desired or predetermined range of overall branching ratios for the device as well as overall light output. For efficient energy use, it is most often desirable to limit transmittance losses.

Figure 5:
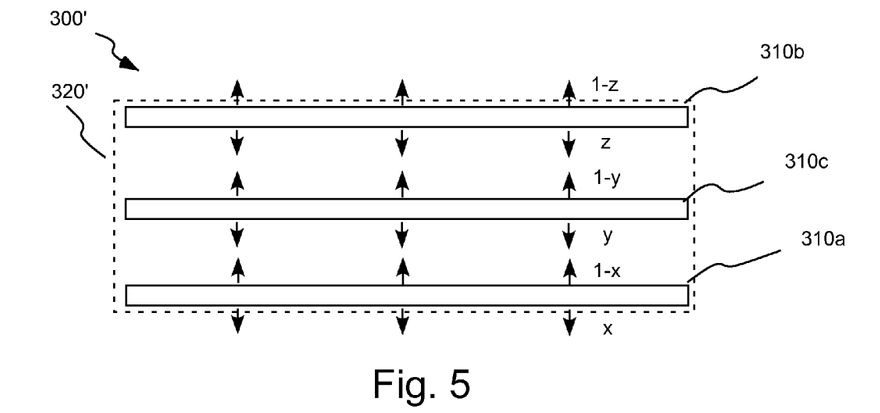
FIG. 5 illustrates schematically another embodiment of a lighting device hereof including three TOLED light panels.

Controllability of illumination is a direct consequence of controllable, non-balanced emission (that is, emission of direct light and indirect light unequally) from the TOLED light panel stacks hereof. In a number of embodiments hereof, at least one TOLED light panel in a stack of a plurality of TOLED light panel emits direct light and indirect light unequally to provide for significant control over the ratio of direct to direct light in a lighting device hereof. In a number of embodiments, the TOLED light panels are chosen so that the imbalance in the overall branching ratio for the lighting device hereof is at least ⅓ or 33% (that is, at least 0.6:0.4 or 0.4:0.6). Many combinations of TOLED light panels are available to provide desired output range and characteristics. For example, in TOLED light panels with different branching ratios and/or with different transmittances may be used. Further, the orientation of one TOLED light panel with respect to another TOLED panel in a lighting device may be chosen such that each TOLED light panel emits a greater percentage of light in the direct direction, so that each TOLED light panel emits a greater percentage of light in the indirect direction, or so that one TOLED light panel emits a greater percentage of light in the direct direction and another TOLED light panel emits a greater percentage of light in the indirect direction. Further, more than two TOLED light panels may be used as described in connection with FIG. 5. In FIG. 5, a TOLED stack 320' includes three TOLED light panels 310a, 310b and 310c having inherent direct to indirect branching ratios of x:1−x, z:1−z and y:1−y, respectively. As clear to one skilled in the art, more than three TOLED light panels may be used.

Figure 6A:
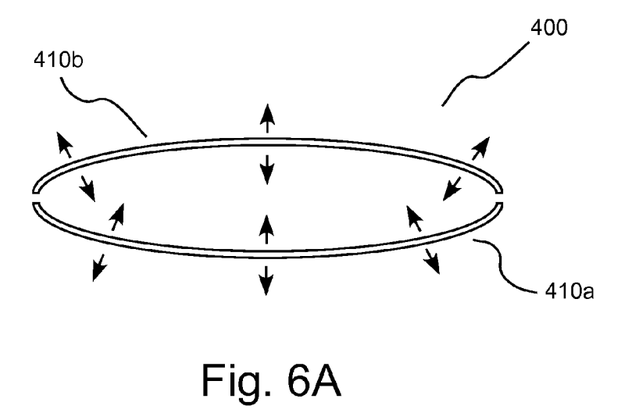
FIG. 6A illustrates a TOLED light panel stack including two curved TOLED light panels.
Figure 6B:
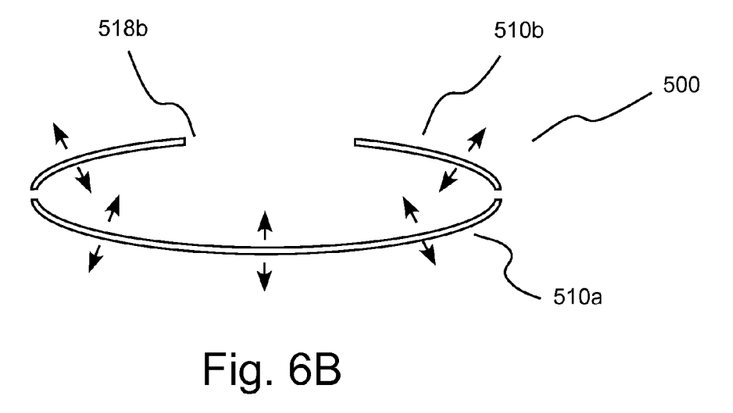
FIG. 6B illustrates a TOLED light panel stack including two curved TOLED light panels wherein the upper TOLED light panel is formed with an open or void area.
Figure 6C:
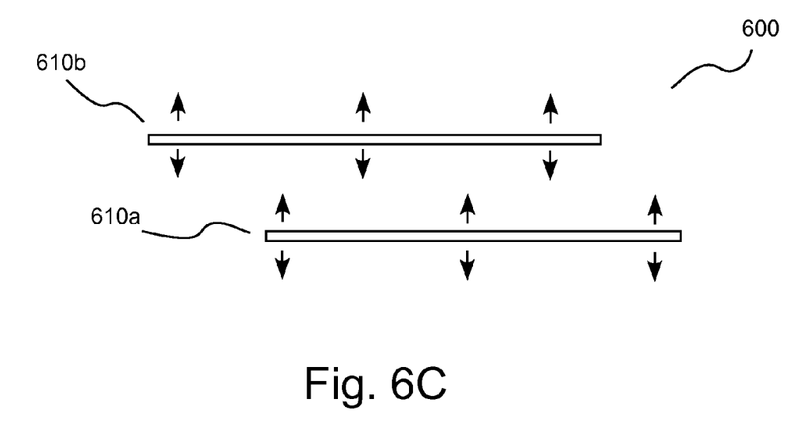
FIG. 6C illustrates a TOLED stack in which the TOLED light panels are offset or misaligned.

OLED/TOLED light panels such as TOLED panels 310a, 310b and/or 310c may be formed in many different conformations. For example, because OLED panels such as TOLED panels 310a, 310b and/or 310c may be formed on a flexible substrate as described above, they are readily formed in virtually any arced, curved or curvilinear profile. FIG. 6A, for example, illustrates a lighting device 400 including two curved or arced TOLED light panels 410a and 410b. Moreover, one or more of the TOLED light panels may be irregularly shaped and/or include open of void areas therein through which light from another TOLED light panel may pass unobstructed. For example, FIG. 6B illustrates a lighting device 500 including two curved or arced TOLED light panels 510a and 510b, wherein TOLED light panel 510b includes an open or void area or region 518b. Moreover, TOLED light panels may be misaligned with respect to each other as illustrated in FIG. 6C in which a lighting device 600 including TOLED light panels 610a and 610b that are partially misaligned.

As used herein, the term "TOLED lighting panel" refers to a panel used for general illumination purposes, in contrast, for example, to an OLED or TOLED display panel. There may be a number of differences between OLED/TOLED lighting panels and display panels. Display panels are used to display images. As a result, smaller devices corresponding to the pixels of the display panel are generally desirable to achieve higher resolutions, and it is also desirable to have pixels with a relatively low aspect ratio so that both vertical and horizontal resolution may be obtained. Also, in a display panel, it is generally desired to independently control the on-off state and intensity of each pixel. A typical way to independently address each pixel of display panels is to use thin film transistors (TFTs). In a lighting panel, larger devices are generally desirable to achieve higher fill factors and high total light output, and it may be less desirable in some circumstances to independently control whether different devices are on or off. Typically there is no need to use thin film transistors inside the OLED active region. A lighting panel may be made to have a fixed color, or be color tunable by having pixels of different colors. In a lighting device it may be desirable to control all pixels of the same color to be at the same luminance. Also, for many uses of a lighting panel, a high Color Rendering Index (CRI) is desirable, while CRI is a lesser consideration in a display panel. CRI is generally reported in terms of general CRI, which is usually denoted by Ra. Conversely, achieving specific CIE coordinates is desirable for the different color devices of a full color display, whereas specific CIE coordinates may be lesser consideration for a lighting panel. The color of a white lighting panel is usually defined by its correlated color temperature.

Figure 7:
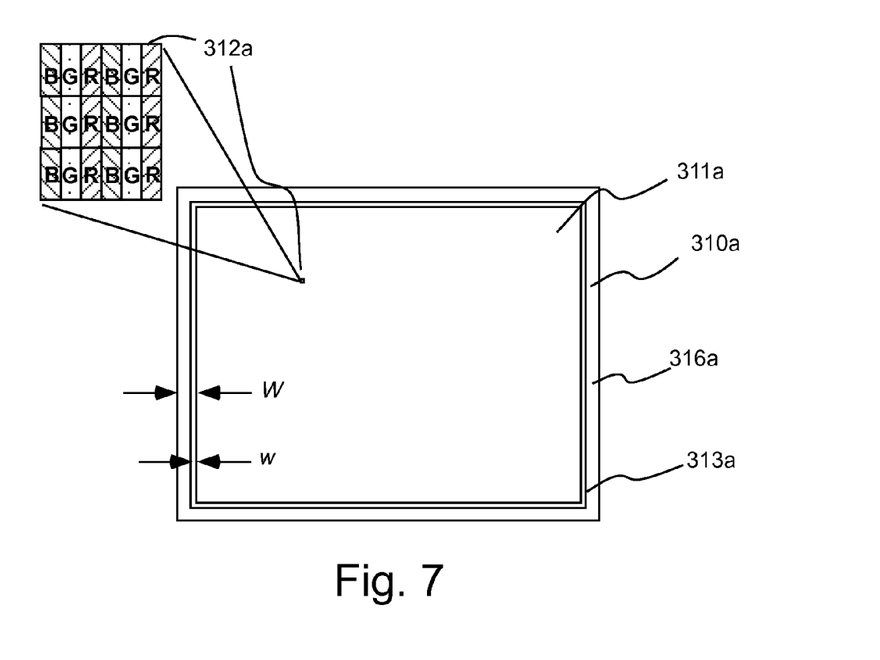
FIG. 7 illustrates a front view of a TOLED light panel hereof including a surrounding bezel.

TOLED light panels typically include a plurality of sub-pixels (each of which includes an individual TOLED lighting device or element) disposed upon a substrate. Alternatively, TOLED light panels may also comprise only one TOLED lighting device. TOLEDs may, for example, create white light by combining differently colored (for example, red, green, and blue) sub-pixels as known in the art in a side-by-side or stacked arrangement. Single emitting white TOLED panels or monochrome colored TOLED panels may also be used herein. FIG. 7 illustrates a representative example of an area 312 of a TOLED light panel 310 in which a red, green blue or RGB stripe sub-pixel pattern is formed. Once again, RGB subpixels may alternatively be stacked in a vertical arrangement. As known to those skilled in the art, a TOLED panel may, for example, include one, tens, hundreds, thousands or more pixels. Associated electronic circuitry may be present to individually drive a group of sub-pixels which emit the same color.

In that regard, light devices such as lighting device 300 include a control system 350 including a driver system 360 (including, for example, one or more drivers) may be in operative connection with panels 310. Driver system 360 may, for example, be in communicative connection with a processor system 370 (including, for example, one or more microprocessors) and an associated memory system 380 (including, for example, one or more memory devices). As described above, control system 360 is operable to independently control the output each of the TOLED light panel in the lighting device (TOLED light panels 310a and 310b in the embodiment of lighting device 300 of FIGS. 3 and 4).

Control system 350 may, for example, provide various control schemes. Control system 350 may, for example, control the intensity of light emitted by TOLED light panel 310a independently from the intensity of light emitted from TOLED light panel 310b to control/alter the ratio of direct light to indirect light emitted by lighting device 300a. Control system 350 may, for example, be operable to control the intensity of light emitted by TOLED light panel 310a independently from the intensity of light emitted by TOLED light panel 310b to achieve the ratio of direct light to indirect light emitted by the lighting device input to control system 350. Control system 350 may, for example, be operable to control the intensity of light emitted by TOLED light panel 310a independently from the intensity of light emitted from TOLED light panel 310b while the ratio of direct light to indirect light emitted by lighting device 300 is maintained substantially constant.

As described above, each OLED light panel may include at least two groups of TOLED elements that emit light with different peak wavelengths. Each TOLED element may, for example, include a TOLED and a fault tolerant structure as, for example, described in U.S. Patent Application Publication No. 2012-0181933 and U.S. patent application Ser. No. 13/590,081, the disclosures of which are incorporated herein by reference. The lighting device may, for example, include a single driver for each TOLED light panel that electrically splits into at least two sub-drivers to operate each group of TOLED elements emitting light of different peak wavelengths. Alternatively, the lighting system may include at least two individual drivers to operate each group. The TOLED elements from one group may, for example, all be connected in parallel and operated by one driver, or one sub-driver. Each group is driven separately, controlled by its own driver, or sub-driver to control the color or color temperature of light emitted by each of the TOLED light panels hereof. The color and/or color temperature of each TOLED light panel may, for example, be controlled independently.

A desirable characteristic for a lighting system is to minimize or eliminate glare. Glare may, for example, be defined as difficulty in viewing an object in the presence of a bright light source, and may be caused by a significant ratio of luminance between the object being viewed and the glare source. The human eye can function from very dark to very bright levels of light. Its sensing capabilities reach across nine orders of magnitude. However, in any given moment of time, the eye can only sense a contrast ratio of approximately 1000. Thus, a high luminance lighting device or luminaire would reduce the ability of human eyes to see certain objects at low luminance. Additionally, glare can cause discomfort, resulting in an instinctive desire to look away from a bright light source (sometimes referred to as discomfort glare). Glare can also cause disability (sometime referred to as disability glare). Furthermore, the spectrum property of the light sources also has an impact on glare. Light at short wavelength causes glare more easily. Providing light indirectly or reflected from a surface in lighting devices hereof reduces or minimizes glare.

Moreover, TOLED light panels may also reduce, minimize or eliminate glare in the direct component of the lighting devices hereof. The root cause of glare in most lighting devices is that the light sources in such lighting devices are "point light sources". In that regard, the light is generated in a relatively small volume (as compared to the total area of the device) with extremely high intensity. Distributing the light from a point light source poses a huge challenge, often requiring complicated optics which significantly reduce the efficacy of such lighting devices and increase the cost thereof. As a result, many light devices exhibit a high contrast and a high peak luminance level. Unlike conventional light sources, however, an OLED/TOLED is a planar, diffused light source. A luminance uniformity of 85%, which corresponds to contrast ratio (CR) of 1.18 has, for example, been achieved in an OLED light panel. Optimization of panel design to achieve such high uniformity and low contrast ratios is, for example, described in U.S. Patent Application Publication No. 2012/0286298, the disclosure of which is incorporated herein by reference.

To reduce or eliminate glare in a number of embodiments hereof, the peak luminance of direct light from TOLED light panels hereof is less than 5,000 cd/m$^2$. While maintaining a peak luminance of the TOLED light panels less than 5,000 cd/m$^2$, the TOLED panels hereof may, for example, provide a luminous emittance at least 7,000 lm/m$^2$. In a number of embodiments, the TOLED panels hereof may provide, for example, up to 10,000-15,000 lm/m$^2$ before they exhibit glare. As used herein, luminous emittance (lm/m$^2$) refers to the total number of lumens emitted by the light emitting assembly divided by the light emitting assembly area, which includes both active emissive area and non-emissive area. The panel area may be smaller than the substrate area, which includes non-emissive areas around the edges of the panel that may be needed for encapsulation, electrical connections, mechanical mounting etc. Reduction, minimization or elimination of glare in OLED/TOLED light panels is, for example, described in U.S. patent application Ser. No. 13/850,028 filed Mar. 25, 2013 and U.S. patent application Ser. No. 13/850,084 filed Mar. 25, 2013.

Virtually all other types of currently available lighting require bulky diffusers etc. to provide luminous emittance of lighting without significant glare. Thus, TOLED light panels hereof, and particularly TOLED light panels including organic phosphorescent emitting materials or PHOLEDs, are well-suited for use in a lighting device. As used herein, the terms, "phosphorescent organic electronic light emitting devices" or "PHOLEDs" refer to organic light emitting devices that include organic phosphorescent emitting materials as light sources. In a number of embodiments hereof, it is desirable to have as much of the light as possible generated from phosphorescent emitting materials, particularly for warm white light. In some embodiments, all photons emitted by the TOLED(s) are of electronic light emitting device hereof may be emitted by organic phosphorescent emitting materials. In embodiments in which cool white light (typically having a color temperature over 5000 K) is to be emitted by TOLED light panels hereof, it may be desirable to use fluorescent blue emitting materials to increase lifetime.

As used herein, the "active area" of a TOLED light panel refers to the emissive area of the panel (that is, the portion of the TOLED panel that emits light). The active area of a TOLED panel thus generally refers to the area defined within the outline or perimeter of the TOLED subpixel pattern thereof, minus any areas within the perimeter not emitting light. In embodiments in which active areas of light emitting assemblies hereof arise from a plurality of TOLED light panel(s) in, for example, a tiled conformation or assembly (see FIG. 8), the active area of the assembly is the total of the active areas of the TOLED light panels thereof.

Improved performance may, for example, be achieved by using high efficiency phosphorescent OLED and optimized panel design. Highly efficient OLED light panels including PHOLEDs are, for example, described in PCT International Patent Application Publication No. WO 2011/146734, the disclosure of which is incorporated herein by reference. When incorporated with bezel-less technologies as disclosed, for example, in U.S. patent application Ser. No. 13/422,924, the disclosure of which is incorporated herein, the width/area of the bezel can be substantially reduced or eliminated. A fill factor of 90% or greater may be achieved. By optimizing panel design, a contrast ratio of 1.1 or less may be achieved. Using such TOLED light panels, TOLED lighting devices or systems with high luminous emittance with no glare (that is, a peak luminance of less than 5000 cd/m$^2$) may be achieved.

Various design approaches and optimization techniques may, for example, be used to maximize the fill factor. Some of the approaches may include, but are not limited to: optimizing panel layout design where narrower and/or less non-emissive metal bus lines are integrated; reducing border and bezel regions on the panel by applying thin film encapsulation; employing novel device structure where emissive bus lines are incorporated; engineering and/or matching sheet resistances of electrodes such that bus lines may be completely eliminated; increasing the thickness of bus lines while reducing the width of bus lines; using highly conductive metal, such as silver or copper, as bus lines; minimizing the coverage of insulator over metal bus lines; using stacked TOLED structure to reduce current density and therefore to reduce the amount of bus lines; applying external wires outside active area to assist current distribution without impacting fill factor; and the combination of thereupon. Such techniques are, for example, discussed in U.S. Patent Application Publication No. 2012/0286298, U.S. patent application Ser. No. 13/422,924, filed Mar. 16, 2012, U.S. patent application Ser. No. 13/547,985, filed Jul. 12, 2012, U.S. Patent Application Publication No. 2012/0286651 and U.S. patent application Ser. No. 13/173,072, the disclosures of which are incorporated herein by reference.

TOLED light panels may, for example, have borders of limited width or be "borderless" TOLED light panels wherein there is little to virtually no gap between a substrate edge and the TOLED active area. Borderless OLED/TOLED displays are, for example, described in U.S. patent application Ser. Nos. 13/422,924 and 13/547,985, and U.S. Pat. Nos. 7,304, 634, 6,885,157, 7,814,652 and 6,620,731 As used herein, the terms "border", "inactive border area", "inactive edge area" or like terms refer to area around the active area of the TOLED panel that is not emissive (that is, the portion of the TOLED panel around the active area from which no light is emitted).

"Borderless" TOLED light panels are facilitate by encapsulation with such thin-film barrier layer encapsulation. As used herein, a "barrier film" or "barrier layer" refers to a layer of material that may be utilized to decrease the permeation of gases, vapors, and/or moisture (or other environmental particulates) into the active device area of the device so as to increase lifetime and/or reduce performance degradation. As describe above, in a number of embodiments, the barrier film may comprise a hybrid layer comprising a mixture of a polymeric material and a non-polymeric material. As used herein, the term "non-polymeric" refers to a material made of molecules having a well-defined chemical formula with a single, well-defined molecular weight. A "non-polymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. For example, in some embodiments, the barrier film may comprise a mixture of polymeric silicon and inorganic silicon. Examples of barrier films are described in more detail in U.S. Pat. No. 7,968,146 and PCT Patent Application Nos. PCT/US2007/023098 and PCT/US2009/042829.

As described above, a preferred barrier layer includes a mixture of a polymeric material and a non-polymeric material. In a number of embodiments, a barrier film is deposited in a thin film deposition technique such as vapor deposition using an organosilicon precursor. The barrier film may, for example, consist essentially of a mixture of polymeric silicon and inorganic silicon. In a number of embodiments, the weight ratio of polymeric silicon to inorganic silicon may be in the range of 95:5 to 5:95. The polymeric silicon and the inorganic silicon may, for example, be created from the same precursor material. In a number of embodiments, at least a 0.1 µm thickness of the barrier film may be deposited under the same reaction conditions for all the reaction conditions in the deposition process. In a number of embodiments, the water vapor transmission rate provided by the barrier film may be less than $10^{-6}$ g/m²/day through the at least 0.1 µm thickness of the barrier film.

In a number of embodiments hereof, the maximum width of any inactive edge area or inactive border area (see, for example, width w of inactive border area 313a surrounding active area 311a in FIG. 7) of a TOLED panel may, for example, be no more than 3 mm, no more than 2 mm, no more than 1 mm, or even no more than 0.1 mm. Although the outline or perimeter of active area 311a (see FIG. 7) of OLED panel 310a is rectangular in shape, the active areas may, for example, be irregular, curved or curvilinear in shape. Regardless of the shape of the active area, the specifications for the maximum width of any associated inactive border area are applicable.

As known in the art, a bezel 316a may be used to surround the light emitting TOLED panel or panels 310a of light emitting assembly 300. OLED/TOLED-based light panels are well-suited to having narrow bezels, so that the light emitting or active area (as defined by panel(s) 310a) can be positioned very close to the outer edge of bezel 316a. Bezel 316a may, for example, have a width W of no greater than 5 mm, no greater than 3 mm, no greater than 1 mm or no greater than 0.1 mm.

Figure 8:
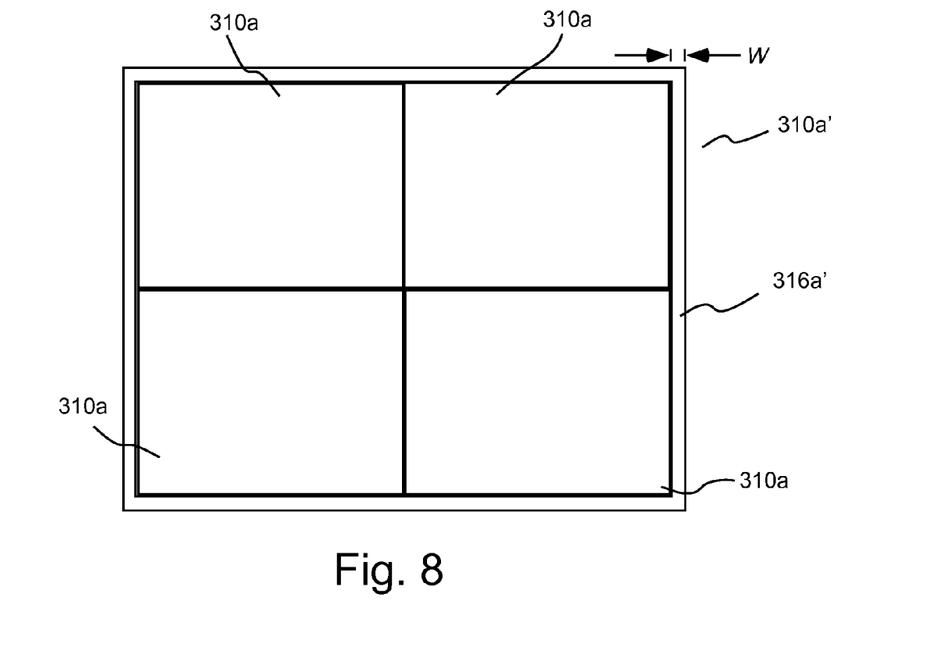
FIG. 8 illustrates a tiled assembly including a plurality of TOLED light panels for use in a lighting device hereof.

To provide lighting devices having a large light emitting area, a plurality of TOLED light emitting panels may, for example, be provided in a tiled arrangement or conformation as illustrated in FIG. 8. In the embodiment of FIG. 8, an assembly 310a' includes a plurality (four in the illustrated embodiment) of TOLED light panels 310a. As clear to those skilled in the art, fewer than four TOLED light panels 310a or greater than four TOLED light panels 310a may be used in an assembly with may be stacked with other TOLED light panel assemblies hereof. TOLED light panel assembly 310a' of FIG. 8 is surrounded by a bezel 316a' which may, for example, have a width W of no greater than 5 mm, no greater than 3 mm, no greater than 1 mm or no greater than 0.1 mm. A plurality of TOLED light panel assemblies such as assembly 310a' may be aligned or stacked in a lighting device to provide independent control of direct and indirect light as described above.

Another significant advantage of TOLED lighting systems in addressing glare is the light quality of OLEDs/TOLEDs. In LED and fluorescent technologies, high energy short wavelength light is critical as it down converted to longer wavelength. However, this high energy light much more easily causes glare to human eyes. OLED/TOLED light panels, may be built with very little high energy light. In a number of embodiments, light emitted in the direct direction by the lighting devices hereof includes no greater than 1% light having a peak wavelength less than 440 nm. The presence of high energy light in light emitted in the indirect direction is of less concern in causing glare.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A lighting device for emitting direct light and indirect light, comprising:
    a first transparent light panel comprising at least one organic light emitting device, the first transparent light panel emitting direct light and indirect light during operation thereof; and
    at least a second transparent light panel comprising at least one organic light emitting device, the second transparent light panel emitting direct light and indirect light during operation thereof, the second transparent light panel being positioned so that at least a portion of indirect light emitted from the first transparent light is transmitted through the second transparent light panel and at least a portion of direct light emitted from the second transparent light panel is transmitted through the first transparent light panel, wherein the first transparent light panel is controllable independently from the second transparent light panel to control a ratio of direct light to indirect light emitted by the lighting device.

2. The lighting device of claim 1 wherein the at least one organic light emitting device of the first transparent light panel is transparent and the at least one organic light emitting device of the second transparent light panel is transparent.

3. The lighting device of claim 2 wherein the first transparent light panel emits direct light and indirect light unequally, and the second transparent light panel emits direct light and indirect light unequally.

4. The lighting device of claim 3 wherein a first ratio of direct light emitted by the first transparent light panel to indirect light emitted by the first transparent light panel is greater than 1, and wherein a second ratio of direct light emitted by the second transparent light panel to indirect light emitted by the second transparent light panel is less than 1.

5. The lighting device of claim 4 wherein the first ratio is approximately equal to the second ratio.

6. The lighting device of claim 3 wherein a first ratio of direct light emitted by the first transparent light panel to indirect light emitted by the first transparent light panel is less than 1, and wherein a second ratio of direct light emitted by the second transparent light panel to indirect light emitted by the second transparent light panel is greater than 1.

7. The lighting device of claim 2 wherein the first transparent light panel comprises a plurality of transparent organic light emitting devices and a color temperature of light emitted therefrom is adjustable.

8. The lighting device of claim 7 wherein the second transparent light panel comprises a plurality of transparent organic light emitting devices and a color temperature of light emitted therefrom is adjustable.

9. The lighting device of claim 2 wherein the first transparent light panel comprises a plurality of transparent organic light emitting devices and a color of light emitted therefrom is adjustable.

10. The lighting device of claim 9 wherein the second transparent light panel comprises a plurality of transparent organic light emitting devices and a color of light emitted therefrom is adjustable.

11. The lighting device of claim 2 wherein the first transparent light panel has a different color or a different color temperature than the second transparent light panel.

12. The lighting device of claim 2 wherein direct light emitted from the lighting device has a peak luminance less than 5,000 cd/m$^2$.

13. The lighting device of claim 2 wherein the lighting device emits greater than 50 lumens of light at maximum illumination.

14. The lighting device of claim 2 wherein the lighting device emits greater than 100 lumens of light at maximum illumination.

15. The lighting device of claim 2 wherein the lighting device emits greater than 150 lumens of light at maximum illumination.

16. The lighting device of claim 2 wherein direct light emitted by the lighting device includes no greater than 1% light having a peak wavelength less than 440 nm.

17. The lighting device of claim 2 wherein at least one of the first transparent light panel and the second transparent light panel is flexible.

18. The lighting device of claim 2 wherein each of the first transparent light panel and the second transparent light panel has a transmittance of at least 10%.

19. The lighting device of claim 2 wherein each of the first transparent light panel and the second transparent light panel has a transmittance of at least 50%.

20. The lighting device of claim 2 wherein each of the first transparent light panel and the second transparent light panel has a transmittance of at least 75%.

21. The lighting device of claim 2 wherein each of the first transparent light panel and the second transparent light panel independently has a transmittance in the range of 10% to 90%.

22. The lighting device of claim 2 further comprising a control system, and the intensity of light emitted by the first transparent light panel is controllable independently from intensity of light from the second transparent light panel via the control system to control the ratio of direct light to indirect light emitted by the lighting device.

23. The lighting device of claim 2 further comprising a control system, and the intensity of light emitted by the first transparent light panel is controllable independently from intensity of light from the second transparent light panel via the control system while the ratio of direct light to indirect light emitted by the lighting device is maintained substantially constant.

24. The lighting device of claim 2 further comprising a control system, and the intensity of light emitted by the first transparent light panel is controllable independently from intensity of light from the second transparent light panel by the control system to achieve the ratio of direct light to indirect light emitted by the lighting device input to the control system.

25. The lighting device of claim 2 where the first transparent lighting panel and the at least second transparent lighting panel are optically coupled together.

26. The lighting device of claim 25 wherein the first transparent lighting panel and the at least second transparent lighting panel are optically coupled together by a transparent adhesive.

27. The lighting device of claim 1 wherein at least one of the first transparent light panel and the second transparent light panel emits direct light and indirect light unequally.

28. The lighting device of claim 1 wherein the lighting device is adapted to achieve an imbalance in the ratio of directly light to indirect light of at least 33%.

29. A method of providing direct light and indirect light, comprising:
providing a first transparent light panel comprising at least one organic light emitting device, the first transparent light panel emitting direct light and indirect light during operation thereof; and
providing at least a second transparent light panel comprising at least one organic light emitting device, the second transparent light panel emitting direct light and indirect light during operation thereof, the second transparent light panel being positioned so that at least a portion of indirect light emitted from the first transparent light is transmitted through the second transparent light panel and at least a portion of direct light emitted from the second transparent light panel is transmitted through the first transparent light panel, and
controlling the first transparent light panel independently from the second transparent light panel to control a ratio of overall direct light to overall indirect light emitted by the first transparent light panel and the second transparent light panel.

30. The method of claim 29 wherein the at least one organic light emitting device of the first transparent light panel is transparent and the at least one organic light emitting device of the second transparent light panel is transparent.

31. The method of claim 30 wherein at least one of the first transparent light panel and the second transparent light panel emits direct light and indirect light unequally.

32. The method of claim 30 wherein the first transparent light panel and the at least a second transparent light panel are adapted to achieve an imbalance in the ratio of at least 33%.

33. The method of claim 30 wherein the first transparent light panel emits direct light and indirect light unequally, and the second transparent light panel emits direct light and indirect light unequally.

34. The method of claim 33 wherein a first ratio of direct light emitted by the first transparent light panel to indirect light emitted by the first transparent light panel is greater than 1, and wherein a second ratio of direct light emitted by the second transparent light panel to indirect light emitted by the second transparent light panel is less than 1.

35. The method of claim 34 wherein the first ratio is approximately equal to the second ratio.

36. The method of claim 33 wherein a first ratio of direct light emitted by the first transparent light panel to indirect light emitted by the first transparent light panel is less than 1, and wherein a second ratio of direct light emitted by the second transparent light panel to indirect light emitted by the second transparent light panel is greater than 1.

37. The method of claim 30 wherein the first transparent light panel comprises a plurality of transparent organic light emitting devices and a color temperature of light emitted therefrom is adjustable.

38. The method of claim 37 wherein the second transparent light panel comprises a plurality of transparent organic light emitting devices and a color temperature of light emitted therefrom is adjustable.

39. The method of claim 30 wherein the first transparent light panel comprises a plurality of transparent organic light emitting devices and a color of light emitted therefrom is adjustable.

40. The method of claim 39 wherein the second transparent light panel comprises a plurality of transparent organic light emitting devices and a color of light emitted therefrom is adjustable.

41. The method of claim 30 wherein the first transparent light panel has a different color or a different color temperature than the second transparent light panel.

42. The method of claim 30 wherein overall direct light emitted from the first transparent light panel and the at least a second transparent light panel has a peak luminance less than 5,000 cd/m$^2$.

43. The method of claim 30 wherein the first transparent light panel and the at least a second transparent light panel emit greater than 50 lumens of overall light at maximum illumination.

44. The method of claim 30 wherein the first transparent light panel and the at least a second transparent light panel emit greater than 100 lumens of overall direct light at maximum illumination.

45. The method of claim 30 wherein the first transparent light panel and the at least a second transparent light panel emits greater than 150 lumens of overall light at maximum illumination.

46. The method of claim 30 wherein overall direct light emitted by the first transparent light panel and the at least a second transparent light panel includes no greater than 1% light having a peak wavelength less than 440 nm.

47. The method of claim 30 wherein at least one of the first transparent light panel and the second light emitting panel is flexible.

48. The method of claim 30 wherein the intensity of light emitted by the first transparent light panel is controlled independently from intensity of light from the second transparent light panel via a control system to control the ratio of overall direct light to overall indirect light emitted by the first transparent light panel and the at least a second transparent light panel.

49. The method of claim 30 wherein the intensity of light emitted by the first transparent light panel is controllable independently from intensity of light from the second transparent light panel via a control system to achieve the ratio of overall direct light to overall indirect light emitted by the first transparent light panel and the at least a second transparent light panel input to the control system.

50. The method of claim 30 wherein the intensity of light emitted by the first transparent light panel is controllable independently from intensity of light from the second transparent light panel via a control system while the ratio of overall direct light to overall indirect light emitted by the first transparent light panel and the at least a second transparent light panel is maintained substantially constant.

51. The method of claim 30 wherein each of the first transparent light panel and the second transparent light panel has a transmittance of at least 10%.

52. The method of claim 30 wherein each of the first transparent light panel and the second transparent light panel has a transmittance of at least 50%.

53. The method of claim 30 wherein each of the first transparent light panel and the second transparent light panel has a transmittance of at least 75%.

54. The method of claim 30 wherein each of the first transparent light panel and the second transparent light panel independently has a transmittance in the range of 10% to 90%.

55. The method of claim 30 where the first transparent lighting panel and the at least second transparent lighting panel are optically coupled together.

56. The method of claim 55 wherein the first transparent lighting panel and the at least second transparent lighting panel are optically coupled together by a transparent adhesive.

57. A method of fabricating a lighting device for emitting direct light and indirect light, comprising:
providing a first transparent light panel comprising at least one organic light emitting device, the first transparent light panel emitting direct light and indirect light during operation thereof; and
providing at least a second transparent light panel comprising at least one organic light emitting device, the second transparent light panel emitting direct light and indirect light during operation thereof, the second transparent light panel being positioned so that at least a portion of direct light emitted from the first transparent light is transmitted through the second transparent light panel and at least a portion of indirect light emitted from the second transparent light panel is transmitted through the first transparent light panel, and
providing a control system in operative connection with the first transparent light panel and the second transparent light panel, wherein the control system controls the first transparent light panel independently from the second transparent light panel to control a ratio of overall direct light to overall indirect light emitted by the first transparent light panel and the at least a second transparent light panel.

58. The method of claim 57 wherein the at least one organic light emitting device of the first transparent light panel is transparent and the at least one organic light emitting device of the second transparent light panel is transparent.

59. The method of claim 58 wherein at least one of the first transparent light panel and the second transparent light panel emits direct light and indirect light unequally.

60. The method of claim 59 wherein the lighting device can emit a minimum imbalance in the ratio of 0.6:0.4.

* * * * *